United States Patent
Jinbo

(10) Patent No.: US 8,488,406 B2
(45) Date of Patent: Jul. 16, 2013

(54) SEMICONDUCTOR DEVICE AND CONTROL METHOD THEREOF

(75) Inventor: Toshikatsu Jinbo, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 215 days.

(21) Appl. No.: 13/157,892

(22) Filed: Jun. 10, 2011

(65) Prior Publication Data

US 2011/0317501 A1    Dec. 29, 2011

(30) Foreign Application Priority Data

Jun. 24, 2010   (JP) .................................. 2010-143634

(51) Int. Cl.
*G11C 5/14* (2006.01)
(52) U.S. Cl.
USPC ...... 365/229; 365/189.04; 365/226; 365/227; 365/230.04
(58) Field of Classification Search
USPC .................................................. 365/189.14
See application file for complete search history.

(56) References Cited

U.S. PATENT DOCUMENTS

| | | | |
|---|---|---|---|
| 6,411,560 B1 * | 6/2002 | Tanizaki et al. ................ | 365/227 |
| 6,519,191 B1 | 2/2003 | Morishita | |
| 6,898,114 B2 * | 5/2005 | Hidaka .......................... | 365/170 |
| 6,958,947 B2 * | 10/2005 | Park et al. ...................... | 365/228 |
| 7,256,644 B2 * | 8/2007 | Ooishi et al. ................... | 327/544 |
| 7,688,670 B2 * | 3/2010 | Horiguchi et al. ............. | 365/226 |
| 7,853,808 B2 * | 12/2010 | Kim et al. ...................... | 713/300 |
| 7,940,112 B2 * | 5/2011 | Okuno et al. .................. | 327/512 |

FOREIGN PATENT DOCUMENTS

JP    2001-127254    5/2001

* cited by examiner

*Primary Examiner* — Tan T. Nguyen
(74) *Attorney, Agent, or Firm* — Young & Thompson

(57) ABSTRACT

A semiconductor device in accordance with an aspect of the present invention includes first and second power-supply circuits each of which generates an internal power-supply voltage by converting a voltage value of a power-supply voltage into a different voltage value, a first internal circuit that receives a supply of the internal power-supply voltage from the first power-supply circuit through a first line, a second internal circuit that receives a supply of the internal power-supply voltage from the second power-supply circuit through a second line, an inter-block line that connects the first and second lines to each other, and a control circuit that operates the first and second internal circuits in a predetermined operating cycle, and controls a length of a period during which the first and second internal circuits operate simultaneously.

15 Claims, 11 Drawing Sheets

Fig. 1

SEMICONDUCTOR DEVICE AND CONTROL METHOD THEREOF

CROSS-REFERENCE TO RELATED APPLICATIONS

This application is based upon and claims the benefit of priority from Japanese patent application No. 2010-143634, filed on Jun. 24, 2010, the disclosure of which is incorporated herein in its entirety by reference.

BACKGROUND

The present invention relates to a semiconductor device and a control method of its internal circuit. In particular, the present invention relates to a semiconductor device including a power-supply circuit that converts the voltage of an externally-supplied electrical power into a different voltage inside the semiconductor device and supplies the converted voltage to internal circuits, and a control method of its internal circuit.

In semiconductor devices, the cost reduction has been achieved by increasing the packaging density and thereby reducing the chip size. Therefore, the miniaturization of the transistors, which constitute memory elements and logic circuits constituting a semiconductor device, has been pursued. Further, as the memory elements and the transistors are miniaturized, it is necessary to lower the internal power-supply voltage applied to these devices in terms of the reliability. However, in order to maintain the compatibility of semiconductor devices with the existing products in the product specifications, there are cases where the power-supply voltage supplied to a semiconductor device needs to be maintained at the conventional voltage, which is higher than the internal power-supply voltage of that semiconductor device.

For example, there is a case where although the specifications of a semiconductor device specify that 1.8 V is to be supplied as the external power-supply voltage, the internal power-supply voltage applicable to the memory elements and the transistors is set to 1.2 V in terms of the reliability. In the case like this, the external power-supply voltage of 1.8 V is lowered to 1.2V by using a voltage-lowering circuit provided within the semiconductor device to generate the internal power-supply voltage, and the generated internal power-supply voltage is supplied to the internal circuits such as an SRAM memory, a DRAM memory, and a logic circuit.

In semiconductor devices like this in which a DC (Direct-Current) voltage conversion circuit such as a voltage-lowering circuit is provided, there are cases where an internal circuit(s), which receives the internal power-supply voltage from the DC voltage conversion circuit, switches its operation state between an operating state and a suspended state. In such cases, a voltage drop occurs in the internal power-supply voltage when the internal circuit switches between an operating state and a suspended state. This voltage drop occurs because the current consumption of the internal circuit rises when the internal circuit changes from a suspended state to an operating state and there is a certain delay between when the current consumption rises and when the DC voltage conversion circuit detects the rise in the current consumption and increases its current supply capability. In the following explanation, the period between when the internal power-supply voltage VDL drops and when the DC voltage conversion circuit starts the current supply is referred to as "response delay period". Accordingly, Japanese Unexamined Patent Application Publication No. 2001-127254 discloses a technique to suppress the fluctuations in the internal power-supply voltage like this.

FIG. 17 shows a schematic diagram of a block layout of a semiconductor device 100 disclosed in Japanese Unexamined Patent Application Publication No. 2001-127254. The semiconductor device 100 shown in FIG. 17 includes a DRAM macro (e.g., memory arrays MA0 and MA1), power-supply control circuits 110a, 110b and 110c, active unit groups 111a and 111b, decoupling capacitances 112a and 112b. In this example, each of the memory arrays MA0 and MA1 has a storage capacity of 16 Mbits at the maximum. Further, the active unit group 111a and the decoupling capacitance 112a are provided for the memory array MA0. The active unit group 111b and the decoupling capacitance 112b are provided for the memory array MA1. The power-supply control circuit 110c is disposed between the power-supply control circuits 110a and 110b.

The power-supply control circuit 110a includes a reference voltage generation circuit that generates a reference voltage VrefS used to generate an array voltage VCCS. The power-supply control circuit 110b includes a circuit that generates a frequency-division clock signal PCLK used to generates a raised voltage VPP. The power-supply control circuit 110c includes a control circuit that generates an array activation signal ACT, an intermediate voltage generation circuit that generates intermediate voltages VBL and VCP, and a standby voltage-lowering circuit. Further, each of the active unit groups 111a and 111b includes DC voltage conversion circuits that generate predetermined voltages (VPP and VCCS) according to the reference voltage VrefS and the control signal ACT. More specifically, each of the active unit groups 111a and 111b includes an active unit AUP that constitutes a Vpp pump, and an active unit AUV that constitutes an active voltage-lowering circuit. The number of the active units AUV and AUP provided in each of these active unit groups 111a and 111b is determined as appropriate according to the storage capacity of the memory arrays MA0 and MA1 and the operating conditions. The decoupling capacitance 112a is disposed between the active unit group 111a and the memory array MA0. The decoupling capacitance 112b is disposed between the active unit group 111b and the memory array MA1.

As described above, in the semiconductor device 100, the decoupling capacitances 112a and 112b are provided between the active unit groups 111a and 111b, which supply the internal power-supply voltage VCCS and the like to the memory arrays MA0 and MA1, and the memory arrays MA0 and MA1. In the semiconductor device 100, the current that is consumed during the response delay period of the active units AUP and AUV of the active unit groups 111a and 111b is covered by the electrical charge accumulated in the decoupling capacitances. In this way, the semiconductor device 100 suppresses the voltage fluctuations in the internal power-supply voltage VCCS and the like during the response delay period.

SUMMARY

However, the present inventors have found the following problem. In general, a decoupling capacitance requires a large chip area to achieve a practical capacitance value. Therefore, there is a problem in the semiconductor device 100 that the chip size becomes larger due to the presence of the decoupling capacitances. In semiconductor devices, the number of circuit elements that operate based on the internal power-supply voltage, such as a DRAM, has been increasing in recent years. Therefore, the necessary capacitance of the decoupling capacitances to suppress the fluctuations in the internal power-supply voltage has also become larger. That is, in recent semiconductor devices, the necessary chip area for these decoupling capacitances has becomes too large to be ignored, and has been getting recognized as a more significant problem.

A first aspect of the present invention is a semiconductor device including: first and second power-supply circuits each of which generates an internal power-supply voltage by converting a voltage value of a power-supply voltage into a different voltage value; a first internal circuit that receives a supply of the internal power-supply voltage from the first power-supply circuit through a first line; a second internal circuit that receives a supply of the internal power-supply voltage from the second power-supply circuit through a second line; an inter-block line that connects the first and second lines to each other; and a control circuit that operates the first and second internal circuits in a predetermined operating cycle, and controls a length of a period during which the first and second internal circuits operate simultaneously.

Another aspect of the present invention is a control method of an internal circuit of a semiconductor device, the semiconductor device including: first and second power-supply circuits each of which generates an internal power-supply voltage by converting a voltage value of a power-supply voltage into a different voltage value; a first internal circuit that receives a supply of the internal power-supply voltage from the first power-supply circuit through a first line; a second internal circuit that receives a supply of the internal power-supply voltage from the second power-supply circuit through a second line; and an inter-block line that connects the first and second lines to each other, the control method including: operating the first and second internal circuits in a predetermined operating cycle; and starting to operate the first internal circuit in a period during which an operation of the second internal circuit is suspended.

In the semiconductor device and the control method of its internal circuit in accordance with an aspect of the present invention, the first line through which an internal power-supply voltage is supplied to the first internal circuit and the second line through which an internal power-supply voltage is supplied to the second internal circuit are connected by means of the inter-block line. Further, in the semiconductor device and the control method of its internal circuit in accordance with an aspect of the present invention, the first and second internal circuits are operated in a predetermined operating cycle, and the length of a period during which the first and second internal circuits operate simultaneously is controlled. In this way, in the semiconductor device and the control method of its internal circuit in accordance with an aspect of the present invention, it is possible to supply the current required in the first internal circuit during the period, which begins at the operation start of the first internal circuit and continues for the response delay period of the first power-supply circuit, from the parasitic capacitance of the second internal circuit. That is, in the semiconductor device and the control method of its internal circuit in accordance with an aspect of the present invention, it is possible to suppress the fluctuations in the internal power-supply voltage sufficiently without using any decoupling capacitances or by using decoupling capacitances having a small capacitance value.

According to a semiconductor device and a control method of its internal circuit in accordance with an aspect of the present invention, it is possible to reduce the necessary circuit area for the decoupling capacitances while suppressing the fluctuations in the intern power-supply voltage.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Embodiments of the present invention are explained hereinafter with reference to the drawings. In the following explanation, a semiconductor device in which memory arrays each composed of DRAM cells arranged in array are provided as internal circuits and the internal circuits are operated at a lowered voltage is explained as an example of a semiconductor device. However, the internal circuits to which the present invention is applicable are not limited to memory arrays composed of DRAM cells, and include other general circuits. Accordingly, FIG. 1 shows a schematic diagram of a block layout of a semiconductor device 1 according to a first embodiment of the present invention.

Figure 1:
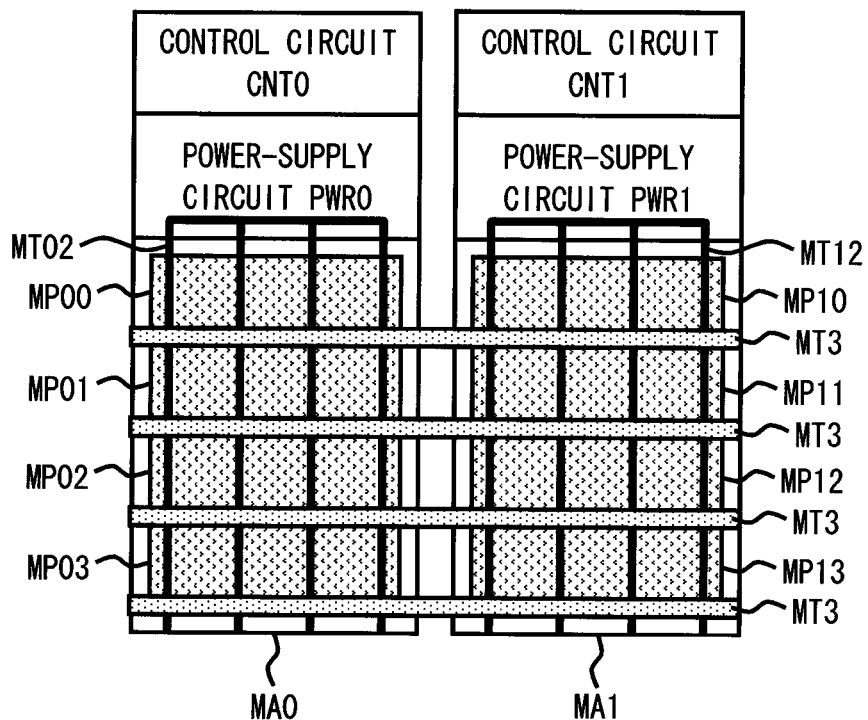
FIG. 1 is a schematic diagram showing a block layout of a semiconductor device according to a first embodiment.

As shown in FIG. 1, the semiconductor device 1 according to the first embodiment includes first and second control circuits (e.g., control circuits CNT0 and CNT1), first and second power-supply circuits (e.g., power-supply circuits PWR0 and PWR1), and first and second internal circuits (e.g., memory arrays MA0 and MA1). Further, in the semiconductor device 1, the control circuit CNT0, the power-supply circuit PWR0, and the memory array MA0 are arranged as one circuit group. Meanwhile, the control circuit CNT1, the power-supply circuit PWR1, and the memory array MA1 are arranged as another circuit group.

Further, in the semiconductor device 1, an internal power-supply voltage VDL0 is output from the power-supply circuit PWR0 and supplied to the memory array MA0 through a first line MT02. Meanwhile, in the semiconductor device 1, another internal power-supply voltage VDL1 is output from the power-supply circuit PWR1 and supplied to the memory array MA1 through a second line MT12. Further, in the semiconductor device 1, the first line MT02 and the second line MT12 are connected to each other through an inter-block line MT3. In this embodiment, assuming that the lowermost wiring layer is defined as "first wiring layer", the first and second lines MT02 and MT12 are formed in a second wiring layer that is formed above the first wiring layer. Meanwhile, the inter-block line MT3 is formed in a third wiring layer that is formed above the second wiring layer. Further, in the semiconductor device 1, the first and second lines MT02 and MT12 are connected to the inter-block line MT3 by using vias.

Next, each block of the semiconductor device 1 is explained hereinafter in detail. Firstly, the memory array MA0 includes memory plates MP00 to MP03. Further, the memory array MA1 includes memory plates MP10 to MP13. Each of the memory plates MP00 to MP03 and MP10 to MP13 includes a plurality of memory cells arranged in a lattice pattern, and each of the memory cells stores data. Further, in the semiconductor device 1, the data access is controlled on a memory-plate basis.

Each of the memory plates MP00 to MP03 and MP10 to MP13 has the same circuit configuration. Therefore, the block layout of the memory plate MP00 is explained as an example of the block layout of the memory plates MP00 to MP03 and MP10 to MP13. Accordingly, FIG. 2 shows a schematic diagram of the block layout of the memory plate MP00.

Figure 2:
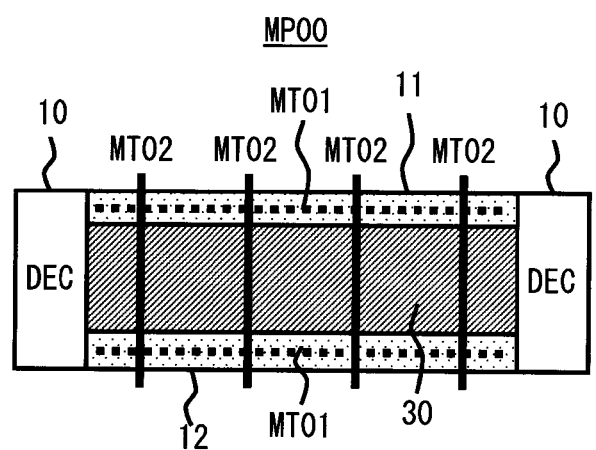
FIG. 2 is a schematic diagram showing a block layout of a memory cell array of a semiconductor device according to a first embodiment.

As shown in FIG. 2, the memory plate MP00 includes a row-column decoder 10, sense amplifiers 11 and 12, and a memory cell arrangement area 30. In the memory cell arrangement area 30, memory cells are arranged in a lattice pattern. The row-column decoder 10 activates a memory cell(s) specified by an externally-supplied address signal. The sense amplifiers 11 and 12 read out data from the activated memory cell(s). Note that the sense amplifiers 11 and 12 include a plurality of sense amplifiers, and the number of these sense amplifiers corresponds to the number of the bit lines.

Further, as shown in FIG. 2, lowermost-layer lines are disposed in the sense amplifiers 11 and 12. Further, a lowermost-layer line MT01 is connected to the first line MT02 formed in the second wiring layer through vias. The internal power-supply voltage VDL0, which is output from the power-supply circuit PWR0, is supplied to the sense amplifiers 11 and 12 through the lowermost-layer line MT01.

Next, the control circuits CNT0 and CNT1 are explained. The control circuit CNT0 switches the memory array MA0 between an operating state and a suspended state at a predetermined operating cycle. The control circuit CNT1 switches the memory array MA1 between an operating state and a suspended state at a predetermined operating cycle. Further, the control circuits CNT0 and CNT1 control the length of a period during which the memory arrays MA0 and MA1 operate simultaneously. In the first embodiment, the control circuits CNT0 and CNT1 control the memory arrays MA0 and MA1 in an exclusive manner. That is, the control circuits CNT0 and CNT1 perform control in such a manner that the memory arrays MA0 and MA1 do not operate at the same time.

Further, the control circuits CNT0 and CNT1 output activation control signals ACT0 and ACT1 respectively that are used to control the activation states of the first and second power-supply circuits PWR0 and PWR1 respectively. The first power-supply circuit PWR0 switches between an activated state and an un-activated state according to the activation control signal ACT0. Meanwhile, the second power-supply circuit PWR1 switches between an activated state and an un-activated state according to the activation control signal ACT1. This switching of the operating state is performed in synchronization with the switching of the memory arrays MA0 and MA1 between an operating state and a suspended state. Specifically, the first power-supply circuit PWR0 becomes an activated state so as to synchronize with the operating state of the memory array MA0, and the second power-supply circuit PWR1 becomes an activated state so as to synchronize with the operating state of the memory array MA1.

Next, the power-supply circuits PWR0 and PWR1 are explained. Each of the power-supply circuits PWR0 and PWR1 converts an externally-supplied external power-supply voltage into a different voltage and outputs the converted voltage as an internal power-supply voltage. In the first exemplary embodiment, each of the power-supply circuits PWR0 and PWR1 converts an external power-supply voltage into an internal power-supply voltage lower than the external power-supply voltage and outputs the converted internal power-supply voltage. The power-supply circuit PWR0 outputs an internal power-supply voltage VDL0 to the memory array MA0 through the first line MT02. Meanwhile, the power-supply circuit PWR1 outputs an internal power-supply voltage VDL1 to the memory array MA1 through the second line MT12.

Figure 3:
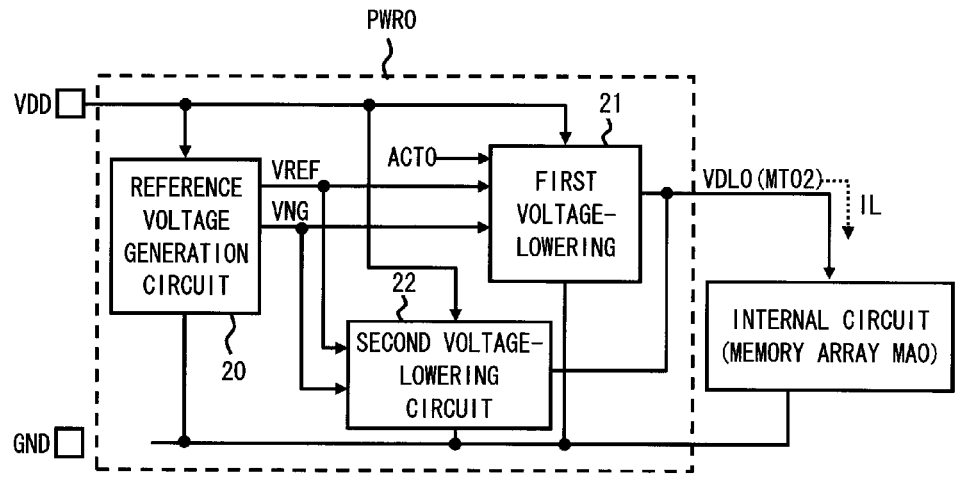
FIG. 3 is a block diagram of a power-supply circuit in a semiconductor device according to a first embodiment.

Details of the power-supply circuits PWR0 and PWR1 are explained hereinafter. Each of the power-supply circuits PWR0 and PWR1 has the same circuit configuration, though the destinations of their internal power-supply voltages are different. Therefore, the circuit configuration and the operation of the power-supply circuit PWR0 are explained as an example of those power-supply circuits. FIG. 3 shows a block diagram of the power-supply circuit PWR0. As shown in FIG. 3, the power-supply circuit PWR0 includes a reference voltage generation circuit 20, a first voltage-lowering circuit 21, and an auxiliary power-supply circuit (e.g., second voltage-lowering circuit 22). Note that in FIG. 3, an internal circuit (e.g., memory array MA0) that receives the internal power-supply voltage VDL0 output by the power-supply circuit PWR0 is also illustrated. Further, assume that the memory array MA0 consumes a load current IL in the operating state. Further, in FIG. 3, a power-supply terminal through which an external power-supply voltage VDD is supplied to the power-supply circuit PWR0, and a ground terminal through which a ground voltage GND is supplied are also illustrated.

The reference voltage generation circuit 20 operates based on the ground voltage GND and the external power-supply voltage VDD. Then, the reference voltage generation circuit 20 generates a reference voltage VREF. The reference voltage generation circuit 20 is a band-gap reference circuit, for example, and generates a voltage of around 1.2 V as the reference voltage VREF. Further, the reference voltage generation circuit 20 also generates a constant voltage VNG that is supplied to the first and second voltage-lowering circuits 21 and 22.

Figure 4:
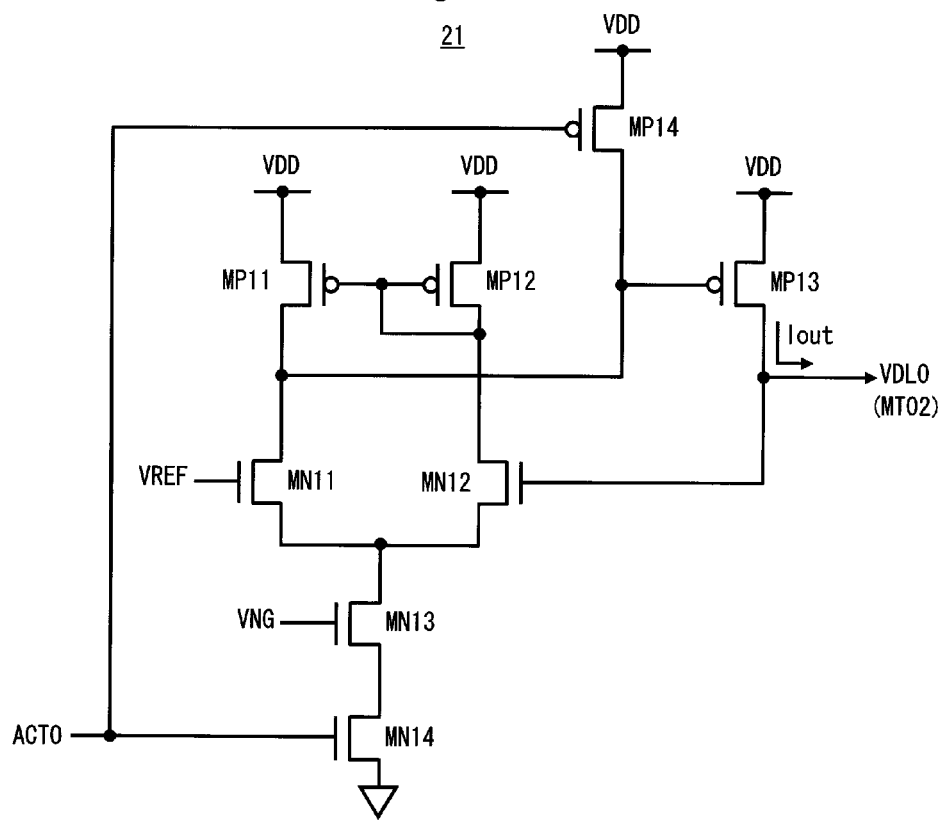
FIG. 4 is a circuit diagram of a first voltage-lowering circuit according to a first embodiment.

The first voltage-lowering circuit 21 lowers the external power-supply voltage VDD and outputs the lowered voltage as an internal power-supply voltage VDL0. More specifically, when the external power-supply voltage VDD is 1.8 V, the first voltage-lowering circuit 21 outputs a voltage of around 1.2 V as the internal power-supply voltage VDL0. Further, the first voltage-lowering circuit 21 has a sufficient current output capability to cover the current consumed in the memory array MA0 in the operating state. Further, the first voltage-lowering circuit 21 is switched between an activated state and an un-activated state according to the activation control signal ACT0 output by the control circuit CNT0. FIG. 4 shows a detailed circuit diagram of the first voltage-lowering circuit 21.

As shown in FIG. 4, the first voltage-lowering circuit 21 includes NMOS transistors MN11 to MN14 and PMOS transistors MP11 to MP14. The ground voltage GND is supplied to the source of the NMOS transistor MN14 and the activation control signal ACT0 is supplied to the gate. The source of the NMOS transistor MN13 is connected to the drain of the NMOS transistor MN14, and the constant voltage VNG is supplied to the gate of the NMOS transistor MN13. The sources of the NMOS transistors MN11 and MN12 are connected to the drain of the NMOS transistor MN13. The NMOS transistors MN11 and MN12 form a differential pair, and are supplied with their operating current from the NMOS transistor MN13. Further, the reference voltage VREF is supplied to the gate of the NMOS transistor MN11. The gate of the NMOS transistor MN12 is connected to the output terminal of the voltage-lowering circuit 21, and the internal power-supply voltage VDL0 is thereby input to the gate.

The PNOS transistors MP11 and MP12 constitute an active load that is provided so as to correspond to the differential pair. More specifically, the external power-supply voltage VDD is supplied to the source of the PMOS transistor MP11, and the drain of the PMOS transistor MP11 is connected to the drain of the NMOS transistor MN11. Further, the gates of the PNOS transistors MP11 and MP12 are connected to each other. The external power-supply voltage VDD is supplied to the source of the PMOS transistor MP12, and the drain of the PMOS transistor MP12 is connected to the drain of the NMOS transistor MN12. Further, the gate and the drain of the PMOS transistor MP12 are connected to each other.

The PMOS transistor MP13 serves as the output transistor of the first voltage-lowering circuit 21. The external power-supply voltage VDD is supplied to the source of the PMOS transistor MP13, and the gate of the PMOS transistor MP13 is connected to the drains of the NMOS transistor MN11 and the PMOS transistor MP11. Further, the drain of the PMOS transistor MP13 serves as the output terminal of the voltage-lowering circuit 21. The drain of the PMOS transistor MP14 is connected to the gate of the PMOS transistor MP13, and the external power-supply voltage VDD is supplied to the source of the PMOS transistor MP14. Further, the activation control signal ACT0 is supplied to the gate of the PMOS transistor MP13.

Figure 5:
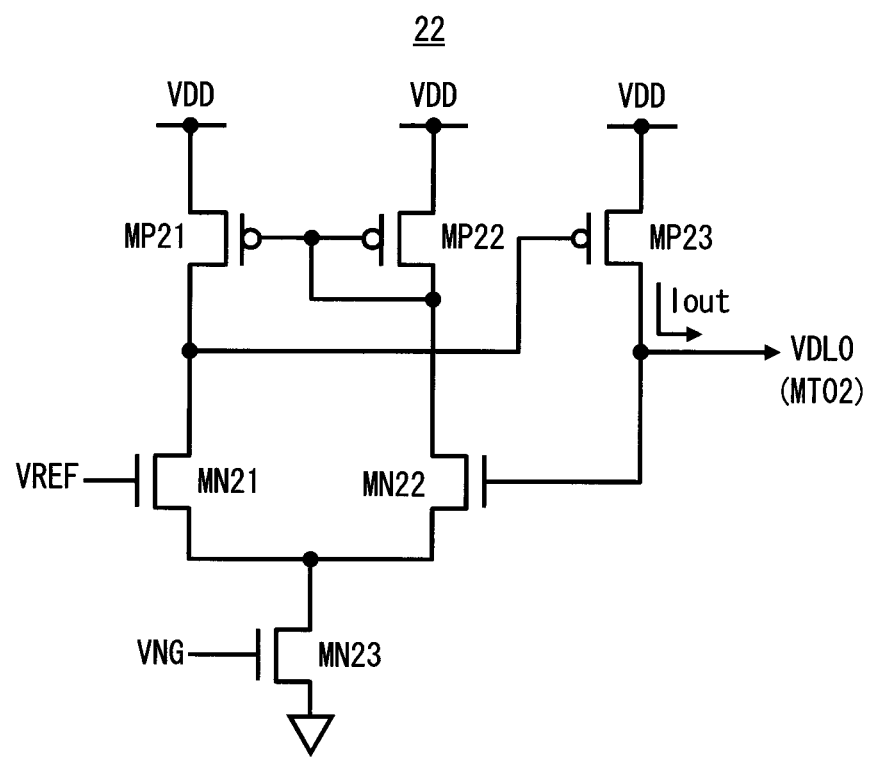
FIG. 5 is a circuit diagram of a second voltage-lowering circuit according to a first embodiment.

The second voltage-lowering circuit 22 lowers the external power-supply voltage VDD and outputs the lowered voltage as an internal power-supply voltage VDL0. More specifically, when the external power-supply voltage VDD is 1.8 V, the second voltage-lowering circuit 22 outputs a voltage of around 1.2 V as the internal power-supply voltage VDL0. Further, the second voltage-lowering circuit 22 has a current output capability corresponding to the leak current that flows through the memory array MA0 in the suspended state. That is, the current drive capability of the second voltage-lowering circuit 22 is smaller than that of the first voltage-lowering circuit 21. Further, the activation control signal ACT0 output from the control circuit CNT0 is not input to the second voltage-lowering circuit 22. That is, the second voltage-lowering circuit 22 is always in the activated state. FIG. 5 shows a detailed circuit diagram of the second voltage-lowering circuit 22.

As shown in FIG. 5, the second voltage-lowering circuit 22 includes NMOS transistors MN21 to MN23 and PMOS transistors MP21 to MP23. The ground voltage GND is supplied to the source of the NMOS transistor MN23 and the constant voltage VNG is supplied to the gate. The sources of the NMOS transistors MN21 and MN22 are connected to the drain of the NMOS transistor MN23. The NMOS transistors MN21 and MN22 form a differential pair, and are supplied with their operating current from the NMOS transistor MN23. Further, the reference voltage VREF is supplied to the gate of the NMOS transistor MN21. The gate of the NMOS transistor MN22 is connected to the output terminal of the second voltage-lowering circuit 22, and the internal power-supply voltage VDL0 is thereby input to the gate.

The PNOS transistors MP21 and MP22 constitute an active load that is provided so as to correspond to the differential pair. More specifically, the external power-supply voltage VDD is supplied to the source of the PMOS transistor MP21, and the drain of the PMOS transistor MP21 is connected to the drain of the NMOS transistor MN21. Further, the gates of the PNOS transistors MP21 and MP22 are connected to each other. The external power-supply voltage VDD is supplied to the source of the PMOS transistor MP22, and the drain of the PMOS transistor MP22 is connected to the drain of the NMOS transistor MN22. Further, the gate and the drain of the PMOS transistor MP22 are connected to each other.

The PMOS transistor MP23 serves as the output transistor of the second voltage-lowering circuit 22. The external power-supply voltage VDD is supplied to the source of the PMOS transistor MP23, and the gate of the PMOS transistor MP23 is connected to the drains of the NMOS transistor MN21 and the PMOS transistor MP21. Further, the drain of the PMOS transistor MP23 serves as the output terminal of the second voltage-lowering circuit 22.

The first and second voltage-lowering circuits 21 and 22 output an output current Iout when the internal power-supply voltage VDL0 decreases below the reference voltage VREF. Further, the first and second voltage-lowering circuits 21 and 22 raise the voltage of the first line MT02 by outputting this output current Iout. Further, the first and second voltage-lowering circuits 21 and 22 stop outputting the output current Iout in response to the condition that the internal power-supply voltage VDL0 becomes higher than the reference voltage VREF. Note that the second voltage-lowering circuit 22 is always in the operating state, and outputs an output current Iout corresponding to the leak current of the memory array MA0. In this way, the semiconductor device 1 prevents such a situation that the voltage of the first line MT02 decreases due to the leak current that flows through the memory array MA0 when the memory array MA0 is in a suspended state. The second voltage-lowering circuit 22 does not need to have a large current output capability nor a fast operating speed (response speed to fluctuations in the internal power-supply voltage VDL0). Therefore, the transistor size of the circuit elements constituting the second voltage-lowering circuit 22 is set to a smaller value than that of the first voltage-lowering circuit 21. Further, the operating current of the second voltage-lowering circuit 22 is also set to a smaller value than that of the first voltage-lowering circuit 21.

The above-described first voltage-lowering circuit 21 is switched between an activated state and an un-activated state according to the activation control signal ACT0. More specifically, when the activation control signal ACT0 is at a high level (enable state, for example, the voltage value of the power-supply voltage VDD), the NMOS transistor MN14 becomes a conductive state and the PMOS transistor MP14 becomes a non-conductive state. That is, during the period in which the activation control signal ACT0 is at a high level, the first voltage-lowering circuit 21 functions as an amplifier composed of the NMOS transistors MN11 to MN13 and the PNOS transistors MP11 to MP13. On the other hand, when the activation control signal ACT0 is at a low level (disable state, for example, the voltage value of the ground voltage GND), the NMOS transistor MN14 becomes a non-conductive state and the PMOS transistor MP14 becomes a conductive state. That is, during the period in which the activation control signal ACT0 is at a low level, the PMOS transistor MP13 of the first voltage-lowering circuit 21 becomes a non-conductive state, and the supply of the ground voltage GND to the NMOS transistor MN13 is thereby stopped. That is, in this state, the first voltage-lowering circuit 21 becomes an un-activated state.

Figure 6:
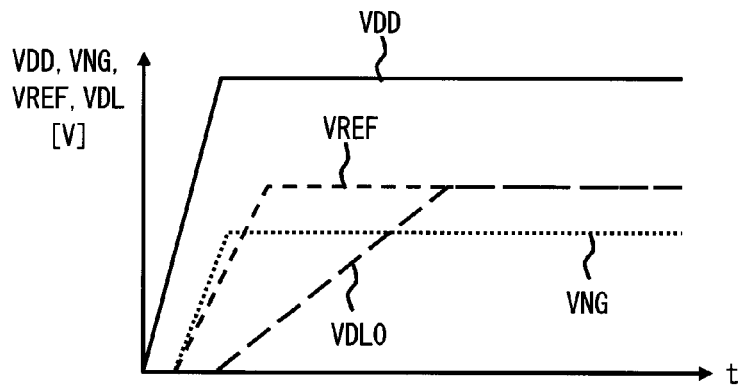
FIG. 6 is a timing chart showing a starting operation of a power-supply circuit according to a first embodiment.

An operation of the power-supply circuit PWR0 is explained hereinafter. Firstly, FIG. 6 shows a timing chart showing a starting operation of the power-supply circuit PWR0. In the operation example shown in FIG. 6, a starting operation of the power-supply circuit PWR0 that is performed when the activation control signal ACT0 is at a high level is shown. Note that the starting operation of the second voltage-lowering circuit 22 is substantially the same as that of the first voltage-lowering circuit 21 shown in FIG. 6. Therefore, the operation of the first voltage-lowering circuit 21 is explained as example in the following explanation of the operation example shown in FIG. 6.

As shown in FIG. 6, in the power-supply circuit PWR0, the reference voltage generation circuit 20 and the first voltage-lowering circuit 21 are in a suspended state until the power-supply voltage VDD rises and reaches a predetermined voltage. Then, when the power-supply voltage VDD reaches the predetermined voltage, the reference voltage generation circuit 20 starts to operate and the reference voltage VREF thereby rises. Further, a voltage source (not shown) also starts to operate and the constant voltage VNG starts to rise. Then, when the constant voltage VNG exceeds the threshold of the NMOS transistor MN13 of the first voltage-lowering circuit 21, the first voltage-lowering circuit 21 starts to operate. However, at the point when the first voltage-lowering circuit 21 has just started operating, the constant voltage VNG and the reference voltage VREF have not reached sufficiently stable voltages yet. Therefore, the output voltage of the first voltage-lowering circuit 21 (e.g., internal power-supply voltage VDL) rises slowly. Then, after the constant voltage VNG and the reference voltage VREF are stabled at predetermined voltages, the first voltage-lowering circuit 21 stabilizes the internal power-supply voltage VDL at a predetermine voltage (e.g., reference voltage VREF).

Figure 7:
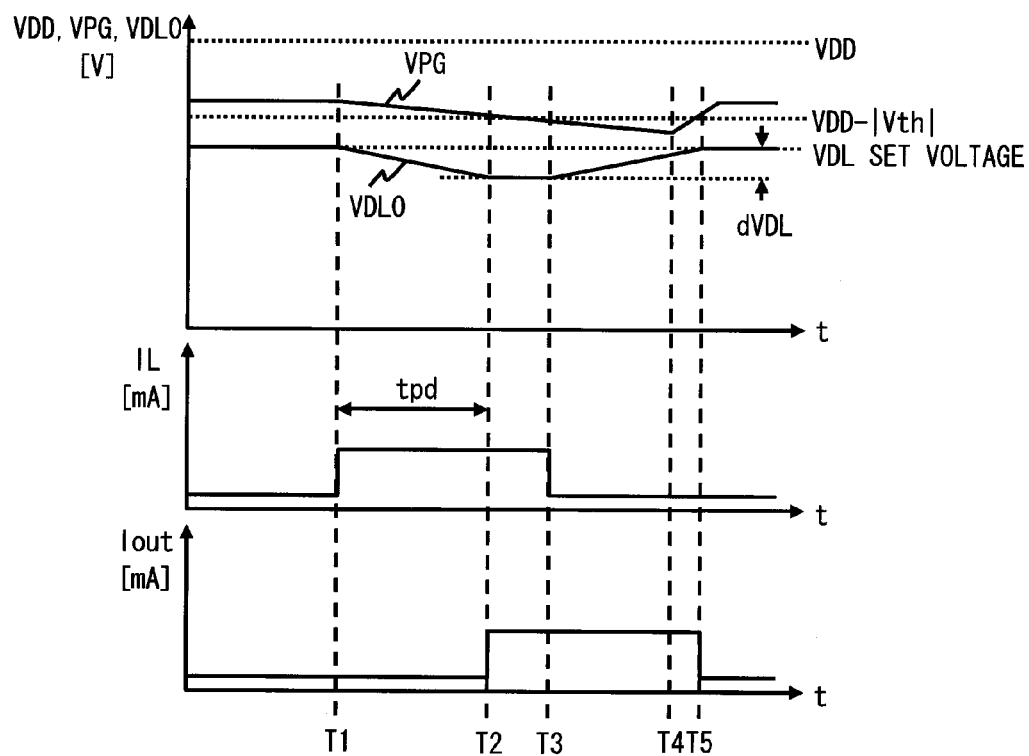
FIG. 7 is a timing chart showing an operation of a power-supply circuit according to a first embodiment against the fluctuations in the load current.

Next, an operation of the power-supply circuit PWR0 against the fluctuations in the load current IL is explained. FIG. 7 shows a timing chart showing an operation of the power-supply circuit PWR0 against the fluctuations in the load current. In the operation example shown in FIG. 7, an operation of the first voltage-lowering circuit 21 that is performed when the activation control signal ACT0 is at a high level is shown. Note that the operation of the second voltage-lowering circuit 22 is substantially the same as that of the first voltage-lowering circuit 21 shown in FIG. 7. Therefore, the operation of the first voltage-lowering circuit 21 is explained as example in the following explanation of the operation example shown in FIG. 7.

In the example shown in FIG. 7, the internal circuit starts to operate at a timing T1. Therefore, before the timing T1, the internal power-supply voltage VDL0 is maintained at a set voltage. Then, as the internal circuit starts to operate at the timing T1, a load current IL starts to flow. However, during the period between the timing T1 and T2, the gate voltage VPG of the drive transistor of the first voltage-lowering circuit 21 (e.g., PMOS transistor MP13) is higher than the threshold voltage (VDD-|Vth|) of the PMOS transistor MP13. Therefore, the first voltage-lowering circuit 21 does not output the output current Iout. During the period between the timing T1 and T2, the load current IL is covered by the electrical charge accumulated in the parasitic capacitance of the internal circuit (e.g., memory arrays MA0 and MA1 and their wiring lines). Therefore, during the period between the timing T1 and T2, the voltage of the internal power-supply voltage VDL0 decreases slowly. Then, as the voltage of the internal power-supply voltage VDL0 decreases, the gate voltage VPG of the PMOS transistor MP13 also decreases.

Then, at the timing T2, when the gate voltage VPG becomes lower than the threshold voltage (VDD-|Vth|), the PMOS transistor MP13 becomes a conductive state. Note that the period from when the internal power-supply voltage VDL0 starts to decrease to when the first voltage-lowering circuit 21 brings the PMOS transistor MP13 into a conductive state (period between the timing T1 and T2) is referred to as "response delay period tpd". Further, in FIG. 7, the magnitude of voltage drop (hereinafter called "voltage drop width") by which the internal power-supply voltage VDL0 decreases during the response delay period tpd is represented as "dVDL". Then, after the response delay period tpd has elapsed, the first voltage-lowering circuit 21 starts to output the output current Iout. In the example shown in FIG. 7, the power-supply circuit is configured so that the load current IL and the output current Iout have the same current value. Therefore, during the period between the timing T2 and T3 during which the load current IL is consumed and the output current Iout is output, the voltage of the internal power-supply voltage VDL0 does not decrease and is maintained at a constant voltage value (e.g., a voltage lower than the set voltage by the voltage dVDL).

Then, at the timing T3 at which the internal circuit stops operating, the load current IL becomes zero. However, at the timing T3, the internal power-supply voltage VDL0 is lower than the set voltage and the gate voltage VPG is also lower than the threshold voltage of the PMOS transistor MP13. Therefore, the voltage-lowering circuit 21 continues to output the output current Iout after the timing T3. Further, an electrical charge is accumulated in the parasitic capacitance of the internal circuit (e.g., memory arrays MA0 and MA1 and their wiring lines) by this output current Tout, and therefore the voltage value of the internal power-supply voltage VDL0 gets closer to the set voltage little by little.

Then, at a timing T4, as the internal power-supply voltage VDL0 gets closer to the set voltage, the gate voltage VPG rises. Further, at a timing T5, when the gate voltage VPG exceeds the threshold of the PMOS transistor MP13, the first voltage-lowering circuit 21 stops outputting the output current Tout.

As described above, when the load current IL flows, the power-supply circuit PWR0 prevents the voltage drop of the internal power-supply voltage VDL0 caused by the load current IL by outputting the output current Iout and maintains the internal power-supply voltage VDL0 within a fixed range.

Figure 8:
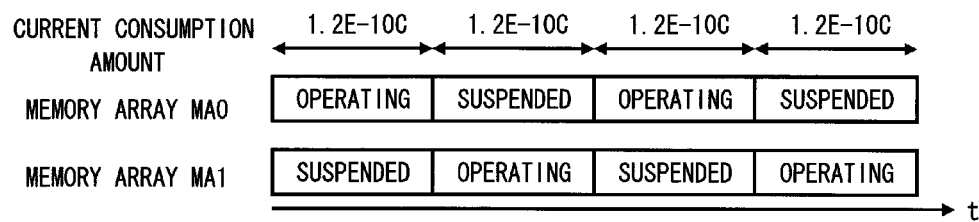
FIG. 8 is a timing chart showing an operation sequence of an internal circuit of a semiconductor device according to a first embodiment.

Next, an operation of the semiconductor device 1 according to the first embodiment is explained. FIG. 8 shows a timing chart showing an operation of the semiconductor device 1. As shown in FIG. 8, in the semiconductor device 1, the control circuits CNT0 and CNT1 operate the memory arrays MA0 and MA1 in an exclusive manner. Further, the control circuits CNT0 and CNT1 operate the memory arrays MA0 and MA1 in a predetermined cycle. Further, the control circuits CNT0 and CNT1 bring the first voltage-lowering circuit of the first power-supply circuit PWR0 and the first voltage-lowering circuit of the second power-supply circuit PWR1 into an activated state in an exclusive manner according to the operating conditions of the memory arrays MA0 and MA1. FIG. 8 shows the amount of electrical charge consumed in the memory arrays MA0 and MA1 in one operating cycle. In the example shown in FIG. 8, an electrical charge of 1.2E-10C is consumed in one operating cycle. That is, in the example shown in FIG. 8, assuming that the length of one operating cycle is 10 nsec, the current consumption of the memory arrays MA0 and MA1 is 12 mA.

In the semiconductor device 1, the memory arrays MA0 and MA1 are operated in an exclusive manner so that the amount of electrical charge required in one operating cycle is substantially equal to the amount of electrical charge required for the operation of one memory array.

Figure 9:
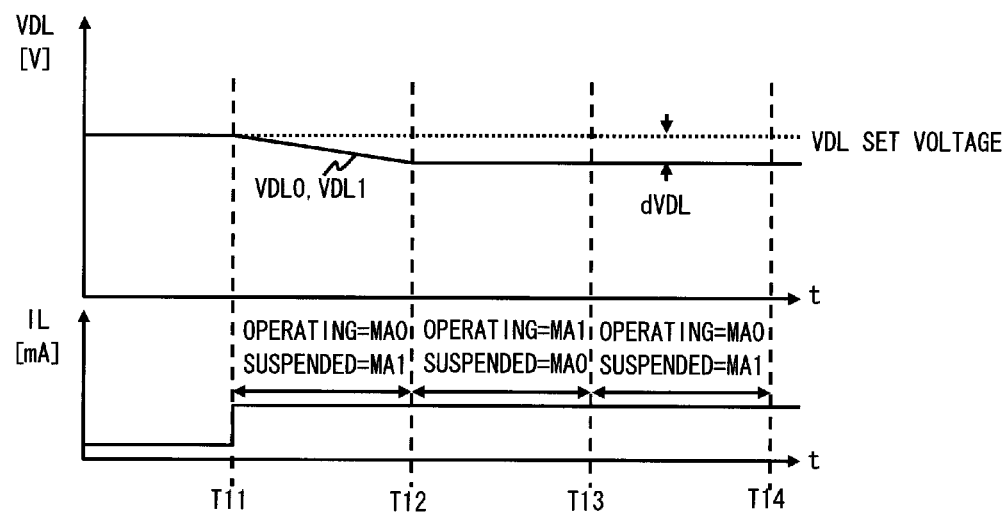
FIG. 9 is a timing chart showing fluctuations in an internal power-supply voltage of a semiconductor device according to a first embodiment.

Next, voltage fluctuations in the internal power-supply voltages VDL0 and VDL1 in the semiconductor device 1 according to the first embodiment are explained. FIG. 9 shows a timing chart showing fluctuations in the internal power-supply voltage of the semiconductor device 1 according to the first embodiment. In the example shown in FIG. 9, before a timing T11, the memory arrays MA0 and MA1 are in a suspended state. Then, at the timing T11, the memory array MA0 starts to operate. Further, timings T12 to T14 show the switching of the operating cycle. Further, in the example shown in FIG. 9, assume that the length of one operating cycle is equal to the length of the response delay period tpd of the first and second power-supply circuits PWR0 and PWR1.

As shown in FIG. 9, in the period between the timing T11 and T12, the memory array MA0 is operated and the memory array MA1 is suspended in the semiconductor device 1. However, because of the response delay period tpd, the internal power-supply voltage VDL0 decreases as a result of the current consumption of the memory array MA0 during the period between the timing T11 and T12. Further, in the semiconductor device 1, the first line MT02, which is provided for the memory array MA0, and the second line MT12, which is provided for the memory array MA1, are connected to each other by means of the inter-block line MT3. Therefore, the internal power-supply voltage VDL1 also decreases in a similar manner to the internal power-supply voltage VDL0.

Then, at the timing T12 at which the memory arrays enter another operating cycle, the memory array MA0 is suspended and the memory array MA1 starts to operate. At this timing T12 at which the operating cycle is switched, the internal power-supply voltage VDL1 has been already lowered. Therefore, the second power-supply circuit PWR1 outputs the output current Iout immediately without having any response delay period tpd. Therefore, the voltage of the internal power-supply voltages VDL0 and VDL1 does not fluctuate at the switching of the operating cycle at the timing T12.

Further, at a timing T13 at which the memory arrays enter another operating cycle, the memory array MA0 starts to operate and the memory array MA1 is suspended. At this timing T13 at which the operating cycle is switched, the internal power-supply voltage VDL0 has been already lowered. Therefore, the first power-supply circuit PWR0 outputs the output current Iout immediately without having any response delay period tpd. Therefore, the voltage of the internal power-supply voltages VDL0 and VDL1 does not fluctuate at the switching of the operating cycle at the timing T13.

Note that in the period from the timing T11 to the timing T14, for the memory array on the suspended-state side, a current equivalent to the leak current of that memory array is supplied from the second voltage-lowering circuit of the corresponding power-supply circuit.

The voltage drop width dVDL in the semiconductor device 1 according to this embodiment is explained hereinafter. In the following explanation, assume that: the load currents IL of the memory arrays MA0 and MA1 are both 12 mA; the internal power-supply voltages VDL0 and VDL1 are both 1.2 V; the response delay period tpd is 10 nsec; and the parasitic capacitances of the memory arrays MA0 and MA1 are both 500 pF.

In this case, the electrical charge amount Q1 that is required during the period from when the internal circuit starts to operate to when the response delay period tpd has elapsed is expressed by Equation (1) shown below.

$$Q1 = 12\text{ mA} \times 10\text{ nsec} = 1.2E\text{-}10C \quad (1)$$

Further, the total electrical charge amount Q2 of the electrical charges that are accumulated in the memory arrays MA0 and MA1 when the internal power-supply voltages VDL0 and VDL1 (=1.2 V) are supplied to the memory arrays MA0 and MA1 respectively and the memory arrays MA0 and MA1 are both in a suspended state is expressed by Equation (2) shown below.

$$Q2 = (500\text{ pF} \times 2) \times 1.2V = 12.0E\text{-}10C \quad (2)$$

Further, during the response delay period tpd, the power-supply circuit PWR0 does not output the output current Iout. Therefore, when one of the memory arrays MA0 and MA1 is operated, the voltage drop width dVDL of the internal power-supply voltages VDL0 and VDL1 is expressed by Equation (3) shown below based on Equations (1) and (2).

$$dVDL = 1.2V \times (1.2E\text{-}10C/12.0E\text{-}10C) = 0.12V \quad (3)$$

That is, a 10% voltage drop occurs during the response delay period tpd in the semiconductor device 1.

In contrast to this, if the inter-block line MT3 is not used in the semiconductor device 1 (i.e., if each of the memory arrays MA0 and MA1 is independently supplied with its electrical power), the electrical charge amount Q3 accumulated in the parasitic capacitance of the memory array MA0 is expressed by Equation (4) shown below.

$$Q3 = 500\text{ pF} \times 1.2V = 6.0E\text{-}10C \quad (4)$$

Further, in this case, the current consumed during the response delay period tpd is covered by the electrical charge amount Q3. Therefore, when the memory array MA0 is operated, the voltage drop width dVDL2 during the response delay period tpd is expressed by Equation (5) shown below.

$$dVDL = 1.2V \times (1.2E\text{-}10C/6.0E\text{-}10C) = 0.24V \quad (5)$$

As explained above, in the semiconductor device 1 according to the first embodiment of the present invention, the first line MT02 of the memory array MA0 and the second line MT12 of the memory array MA1 are connected to each other through the inter-block line MT3. As a result, the capacitance value of the parasitic capacitance of a circuit area corresponding to one power-supply circuit is apparently increased in the semiconductor device 1, so that the voltage drop width of the internal power-supply voltage VDL during the response delay period tpd can be reduced. Specifically, if the inter-block line MT3 is not used, a voltage drop of 0.24 V occurs as indicated by the above-mentioned Equation (5). In contrast to this, in the semiconductor device 1 according to the first embodiment of the present invention, the voltage drop is reduced to 0.12 V as indicated by Equation (3). That is, the amount of the voltage drop is halved compared to the related art.

Further, to reduce the amount of the voltage drop in a semiconductor device in the related art to the same level as that in the semiconductor device 1 according to the first embodiment of the present invention, it is necessary to provide decoupling capacitances as in the case of Japanese Unexamined Patent Application Publication No. 2001-127254. These decoupling capacitances occupy a large area in the chip, thus becoming an obstacle to the reduction in the chip size. By contrast, in the semiconductor device 1 according to the first embodiment of the present invention, it is possible to reduce the voltage drop without using decoupling capacitances. That is, in the semiconductor device 1, it is possible to reduce the chip size while preventing the voltage drop in the internal power-supply voltage.

Further, in the semiconductor device 1 according to the first embodiment of the present invention, the power-supply circuit includes a first voltage-lowing circuit that supplies a current consumed in an operating state of a memory array, and a second voltage-lowing circuit that supplies a current equivalent to the leak current in a suspended state of the memory array. Further, in the semiconductor device 1, the first voltage-lowing circuit supplies a current consumed in an operating memory array while the second voltage-lowing circuit supplies a current equivalent to the leak current in a suspended memory array. With configuration like this, the semiconductor device 1 can suppress the voltage fluctuations in the internal power-supply voltage in the period during which the memory array is operating. Further, in the semiconductor device 1, the power-supply circuit does not need to have an excessive current supply capability, thus making it possible to reduce the circuit size and the power consumption of the power-supply circuit.

Further, in the semiconductor device 1 according to the first embodiment, two pairs each consisting of a memory array and a power-supply circuit are operated in an exclusive manner. More specifically, the exclusive operations like this can be achieved by operating the control circuits CNT0 and CNT1 in cooperation. In this way, in the semiconductor device 1, it is possible to suppress the fluctuations in the internal power-supply voltage while reducing the power consumption during operations. Further, since the fluctuations in the internal power-supply voltage can be suppressed, there is no need to set the current supply capability of the power-supply circuit to an excessively large value, thus making it possible to reduce the circuit size of the power-supply circuit.

Second Embodiment

Figure 10:
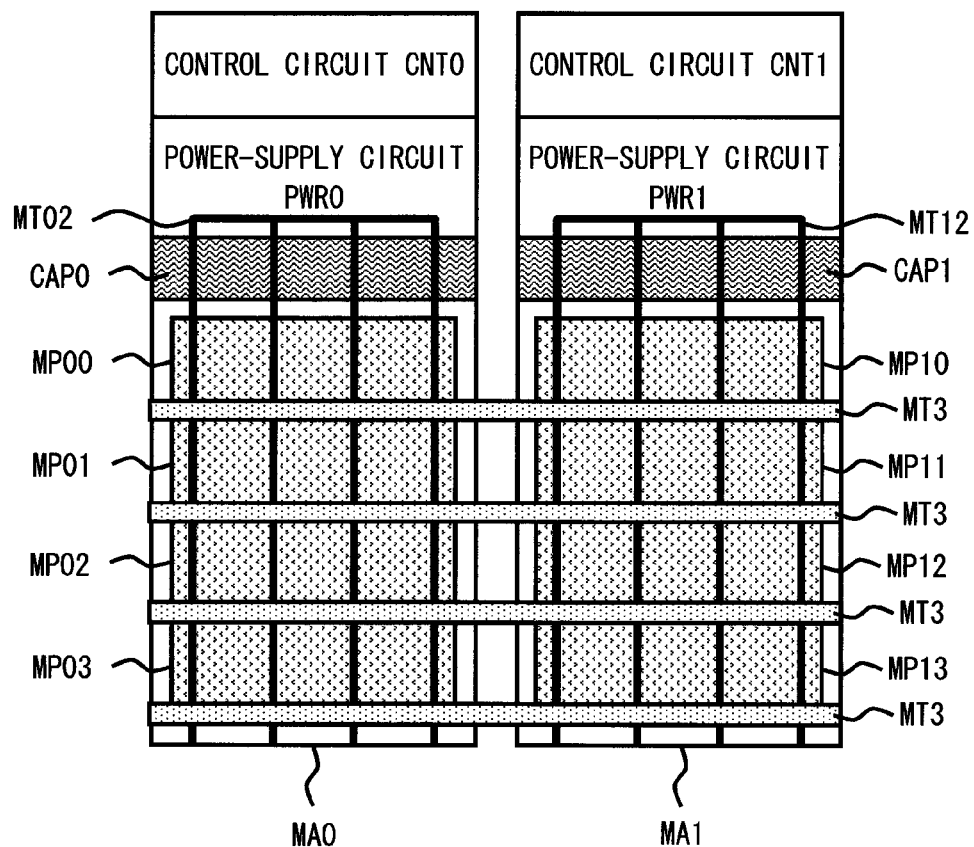
FIG. 10 is a schematic diagram showing a block layout of a semiconductor device according to a second embodiment.

FIG. 10 shows a schematic diagram of a block layout of a semiconductor device 2 according to a second embodiment of the present invention. Note that in the following explanation of the semiconductor device 2 according to the second embodiment, the same components as those of the semiconductor device 1 according to the first embodiment are denoted by the same symbols as those of the first embodiment, and their explanations are omitted.

As shown in FIG. 10, the semiconductor device 2 is obtained by adding two decoupling capacitances CAP0 and CAP1 in the semiconductor device 1. The decoupling capacitance CAP0 is disposed between the power-supply circuit PWR0 and the memory array MA0. The decoupling capacitance CAP1 is disposed between the power-supply circuit PWR1 and the memory array MA1. Further, the decoupling capacitance CAP0 is connected to the first line MT02 while the decoupling capacitance CAP1 is connected to the second line MT12.

Figure 11:
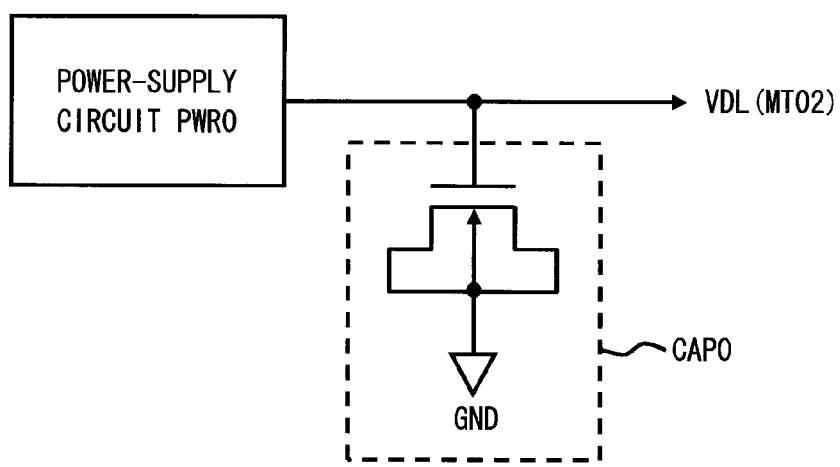
FIG. 11 is a circuit diagram of a decoupling capacitance of a semiconductor device according to a second embodiment.

Each of the decoupling capacitances CAP0 and CAP1 includes a capacitor(s) composed of an NMOS transistor(s). Therefore, FIG. 11 shows a circuit diagram of the decoupling capacitance CAP0. In FIG. 11, only one of a plurality of NMOS transistors are illustrated. Each of the other transistors (not shown) is connected in the same manner as the NMOS transistor shown in FIG. 11. As shown in FIG. 11, the decoupling capacitance CAP0 is composed of an NMOS transistor(s). Further, the gate of the NMOS transistor is connected to the first line MT02, and a ground voltage GND is supplied to the source, the drain, and the back-gate terminal of the NMOS transistor. With the connection like this, the NMOS transistor forms a gate capacitance between the gate and the back-gate and the like in a state that the internal power-supply voltage VDL reaches a predetermined voltage. In the semiconductor device 2 according to the second embodiment, this gate capacitance is used as a decoupling capacitance.

Figure 12:
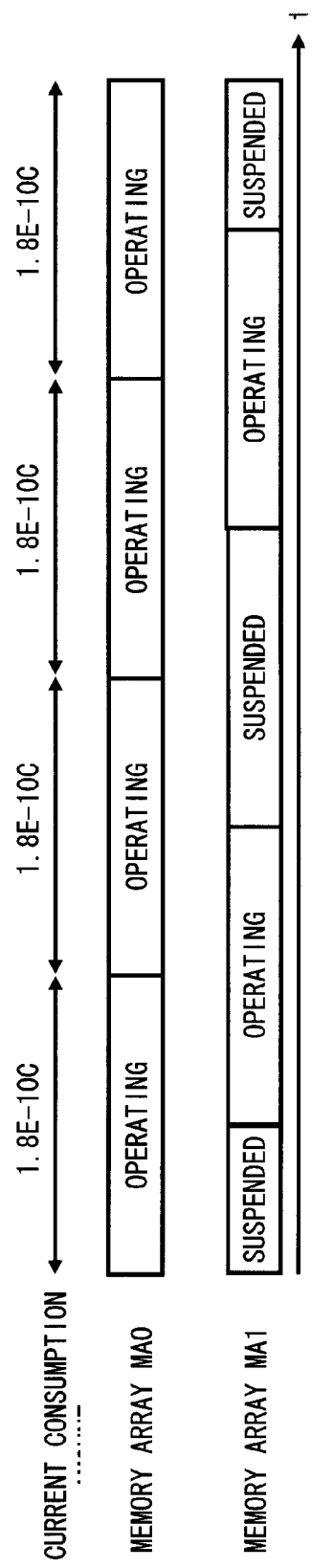
FIG. 12 is a timing chart showing an operation sequence of an internal circuit of a semiconductor device according to a second embodiment.

The semiconductor device 2 according to the second embodiment includes the decoupling capacitances CAP0 and CAP1, so that the semiconductor device 2 has a period during which the memory arrays MA0 and MA1 are operated at the same time. Accordingly, FIG. 12 shows a timing chart showing an operation sequence of an internal circuit of the semiconductor device 2. As shown in FIG. 12, the memory array MA0 is continuously operated in the semiconductor device 2. Meanwhile, the memory array MA1 is switched between an operating state and a suspended state according to the operating cycle. Further, the memory array MA1 operates during a period that begins at the second half of one operating cycle (hereinafter called "first operation cycle") of the memory array MA0 and ends at the first half of a second operating cycle subsequent to the first operating cycle. Further, the memory array MA1 is suspended during a period that begins at the second half of the second operation cycle and ends at the first half of a third operating cycle subsequent to the second operating cycle. By operating the memory arrays MA0 and MA1 in this manner, the amount of the electrical charge consumed during one operating cycle of the memory array MA0 becomes one-and-a-half times the electrical charge consumed by the memory array MA0 alone (e.g., 1.8E-10C).

The amount of voltage drop of the internal power-supply voltage in the semiconductor device 2 is explained hereinafter. In the following explanation, assume that: the capacitance values of the decoupling capacitances CAP0 and CAP1 are both 250 pF; the internal power-supply voltages VDL0 and VDL1 are both 1.2 V; and the parasitic capacitances of the memory arrays MA0 and MA1 are both 500 pF.

Firstly, the electrical charge amount Q4 that is accumulated in the memory arrays MA0 and MA1 and the decoupling capacitances CAP0 and CAP1 when a voltage of 1.2 V is supplied to the memory arrays MA0 and MA1 as the internal power-supply voltages VDL0 and VDL1 and the memory arrays MA0 and MA1 are both in a suspended state is expressed by Equation (6) shown below.

$$Q4=(500\ \text{pF}\times2+250\ \text{pF}\times2)\times1.2\text{V}=18.0E\text{-}10C \quad (6)$$

Further, during the response delay period tpd, the power-supply circuit PWR0 does not output the output current Iout. Further, the electrical charge consumed during one operating cycle of the memory array MA0 is 1.8E-10C. Accordingly, the voltage drop width dVDL of the internal power-supply voltages VDL0 and VDL1 during the response delay period tpd is expressed by Equation (7) shown below based on Equation (6).

$$dVDL = 1.2\text{V} \times (1.8E\text{-}10C/18.0E\text{-}10C) = 0.12\text{V} \qquad (7)$$

That is, a 10% voltage drop occurs during the response delay period tpd in the semiconductor device 2.

As explained above, in the semiconductor device 2, it is possible to prevent the voltage drop in the internal power-supply voltage while increasing the number of memory arrays that can operate in parallel by using the decoupling capacitances CAP0 and CAP1.

Further, in the semiconductor device 2, the decoupling capacitances CAP0 and CAP1 are connected to each other through the inter-block line MT3. Therefore, even in the case where the current consumption of the memory array MA0 increases, even if the capacitance value of a capacitance provided for one memory array is reduced, it can be used as a capacitance equivalent to the sum of a plurality of decoupling capacitances. That is, in the semiconductor device 2, the voltage drop in the internal power-supply voltage can be effectively suppressed by using a smaller decoupling capacitance(s).

Third Embodiment

Figure 13:
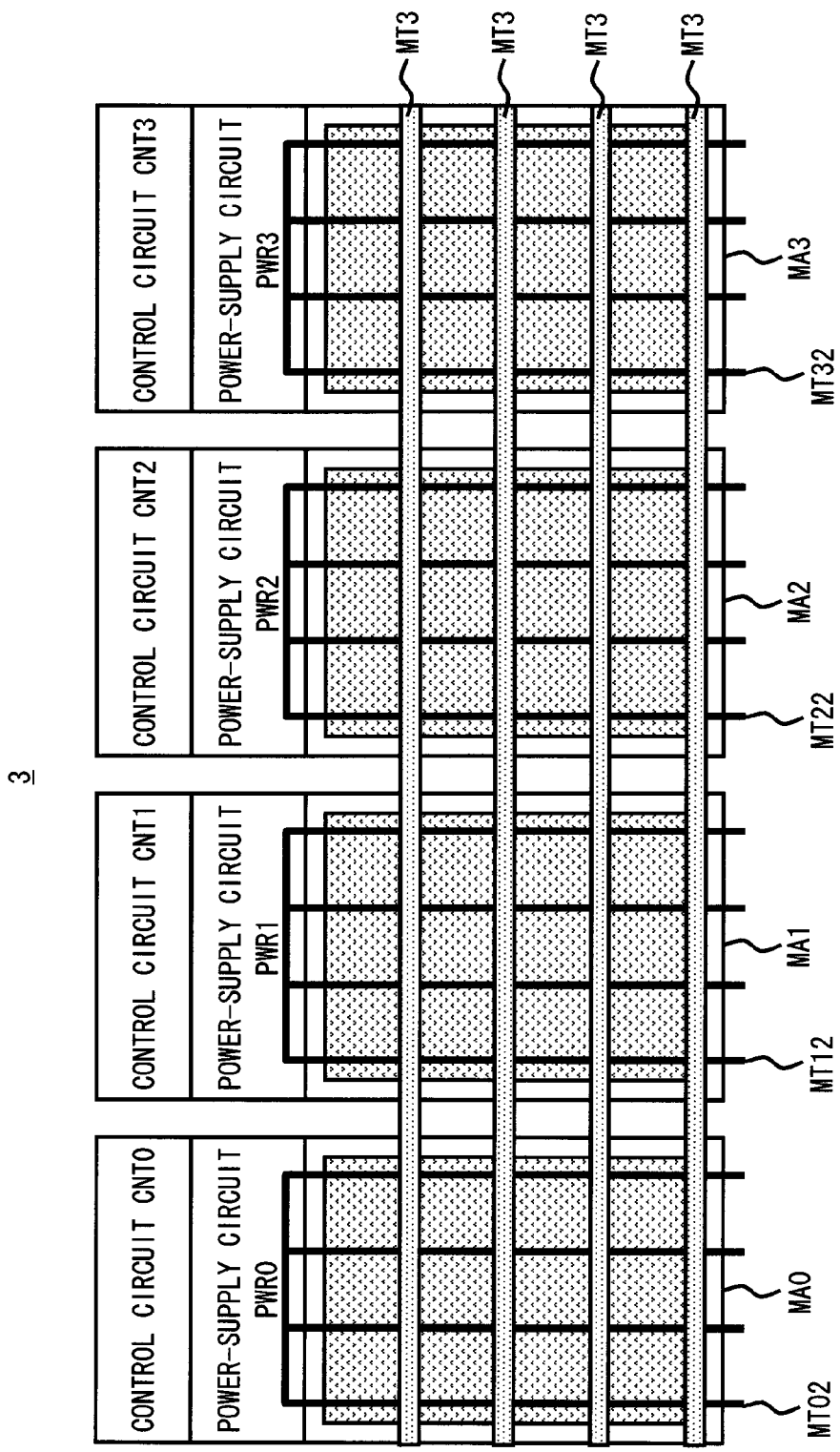
FIG. 13 is a schematic diagram showing a block layout of a semiconductor device according to a third embodiment.

FIG. 13 shows a schematic diagram of a block layout of a semiconductor device 3 according to a third embodiment of the present invention. As shown in FIG. 13, the semiconductor device 3 according to the third embodiment is obtained by extending the two sets of memory arrays, power-supply circuits, and control circuits in the semiconductor device 1 according to the first embodiment to four sets That is, as the third embodiment, a semiconductor device including a larger number of memory arrays is explained.

As shown in FIG. 13, the semiconductor device 3 includes control circuits CNT0 to CNT3, power-supply circuits PWR0 to PWR3, and memory arrays MA0 to MA3. Note that each of the control circuits CNT0 to CNT3, the power-supply circuits PWR0 to PWR3, and the memory arrays MA0 to MA3 has the same circuit configuration as that of the control circuit CNT0, the power-supply circuit PWR0, and the memory array MA0 respectively, which are explained in the first embodiment. Further, in the semiconductor device 3, the power-supply circuit PWR0 supplies an internal power-supply voltage VDL0 to the memory array MA0 through a first line MT02. The power-supply circuit PWR1 supplies an internal power-supply voltage VDL1 to the memory array MA1 through a second line MT12. The power-supply circuit PWR2 supplies an internal power-supply voltage VDL2 to the memory array MA2 through a third line MT22. The power-supply circuit PWR3 supplies an internal power-supply voltage VDL3 to the memory array MA3 through a fourth line MT32. Further, in the semiconductor device 3, the first to fourth lines MT02 to MT32 are mutually connected through an inter-block line MT3.

Similarly to the semiconductor device 1 according to the first embodiment, two memory arrays are handled as one control unit pair in the semiconductor device 3. That is, in the semiconductor device 3, the memory arrays MA0 and MA1 are controlled in an exclusive manner, and the memory arrays MA2 and MA3 are controlled in an exclusive manner. Accordingly, FIG. 14 shows a timing chart showing an operation sequence of an internal circuit of the semiconductor device 3.

Figure 14:
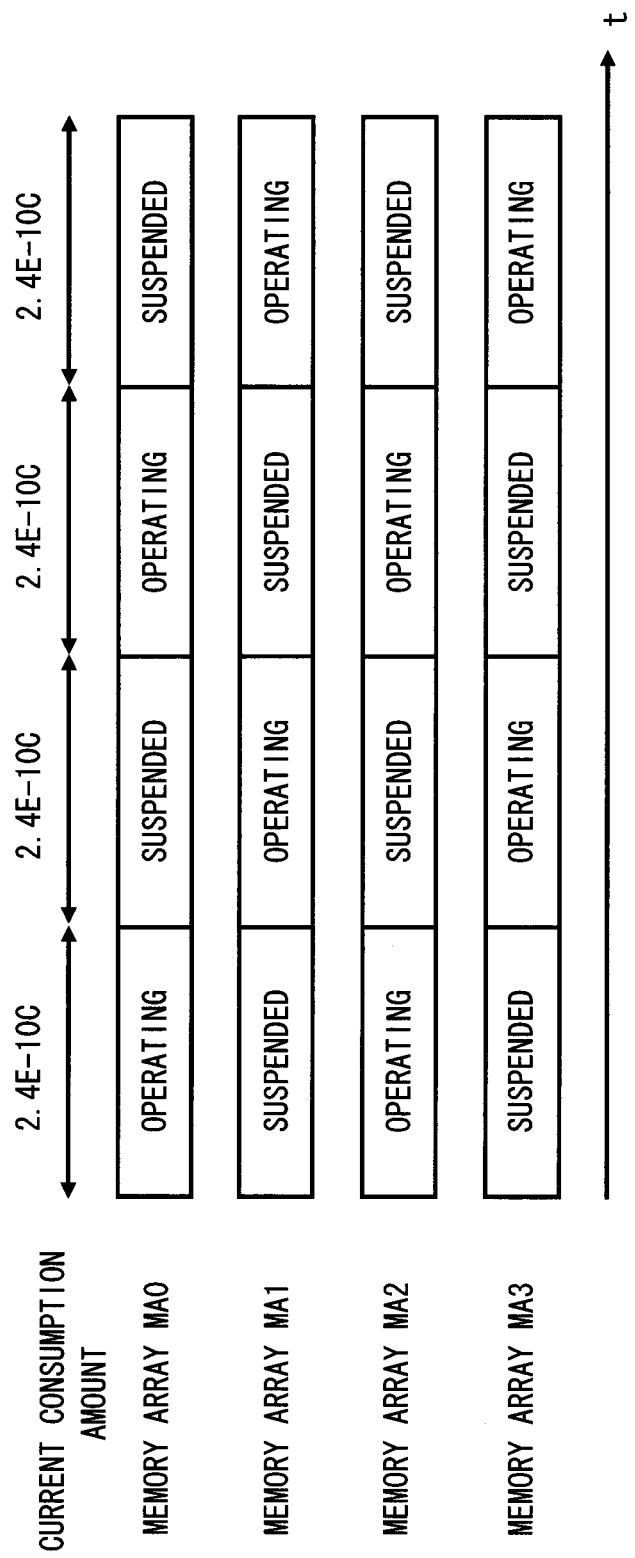
FIG. 14 is a timing chart showing an operation sequence of an internal circuit of a semiconductor device according to a third embodiment.

As shown in FIG. 14, in the semiconductor device 3, an even-numbered memory array (e.g., memory array MA0 or MA2) and an odd-numbered memory array (e.g., memory array MA1 or MA3) are controlled in an exclusive manner.

Note that in the semiconductor device 3, the first to fourth lines MT02 to MT32 are mutually connected through the inter-block line MT3. Therefore, similarly to the first embodiment, the electrical charge consumed during the response time of the power-supply circuit is covered by the electrical charge accumulated in the parasitic capacitance of the two memory arrays. Accordingly, similarly to the first embodiment, the voltage drop in the internal power-supply voltage is also prevented in the semiconductor device 3.

As can be understood from the above explanation, the control method in the semiconductor device 1 according to the first embodiment is also applicable to a semiconductor device including a larger number of memory arrays. Further, in the semiconductor device 3, the processing power of the semiconductor device can be improved by operating a plurality of memory arrays in parallel.

Fourth Embodiment

Figure 15:
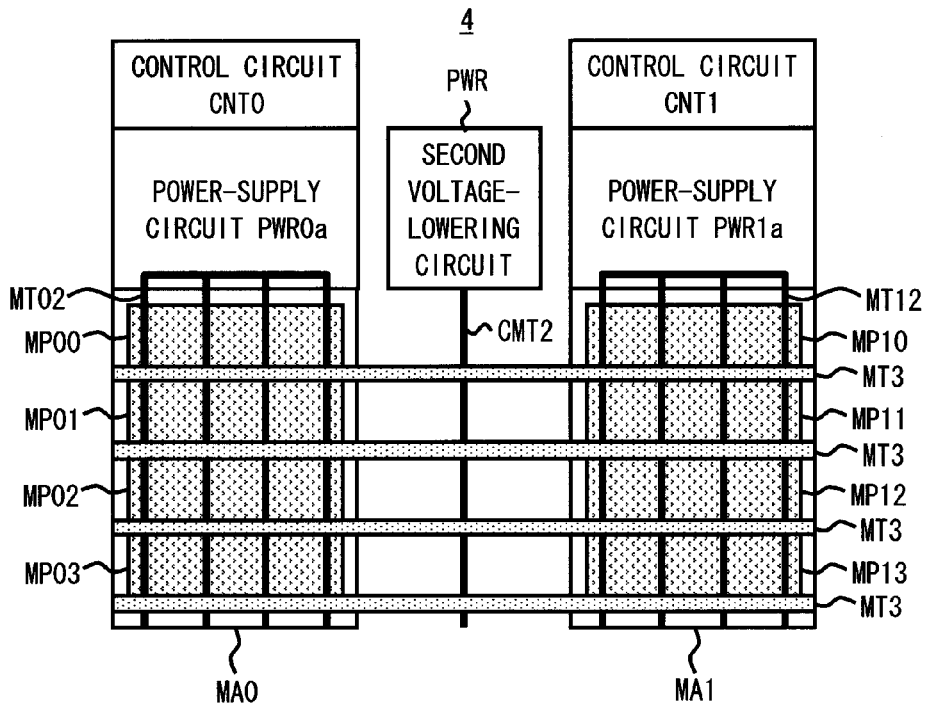
FIG. 15 is a schematic diagram showing a block layout of a semiconductor device according to a fourth embodiment.

FIG. 15 shows a schematic diagram of a block layout of a semiconductor device 4 according to a fourth embodiment of the present invention. As shown in FIG. 15, the semiconductor device 4 is obtained by modifying the first embodiment in such a manner that the second voltage-lowing circuit, which is provided in the power-supply circuit in the first embodiment, is provided as a separate circuit from the power-supply circuit. Further, the semiconductor device 4 includes power-supply circuits PWR0a and PWR1a in place of the power-supply circuits PWR0 and PWR1. Theses power-supply circuits PWR0a and PWR1a are obtained by removing the second voltage-lowing circuit from the power-supply circuits PWR0 and PWR1 respectively. That is, in the semiconductor device 4, one second power-supply circuit, which operates irrespective of the operating state of the memory arrays MA0 and MA1, is provided for a plurality of memory arrays. In FIG. 15, the second power-supply circuit, which is provided for a plurality of memory arrays, is denoted by a symbol "PWR".

Figure 16:
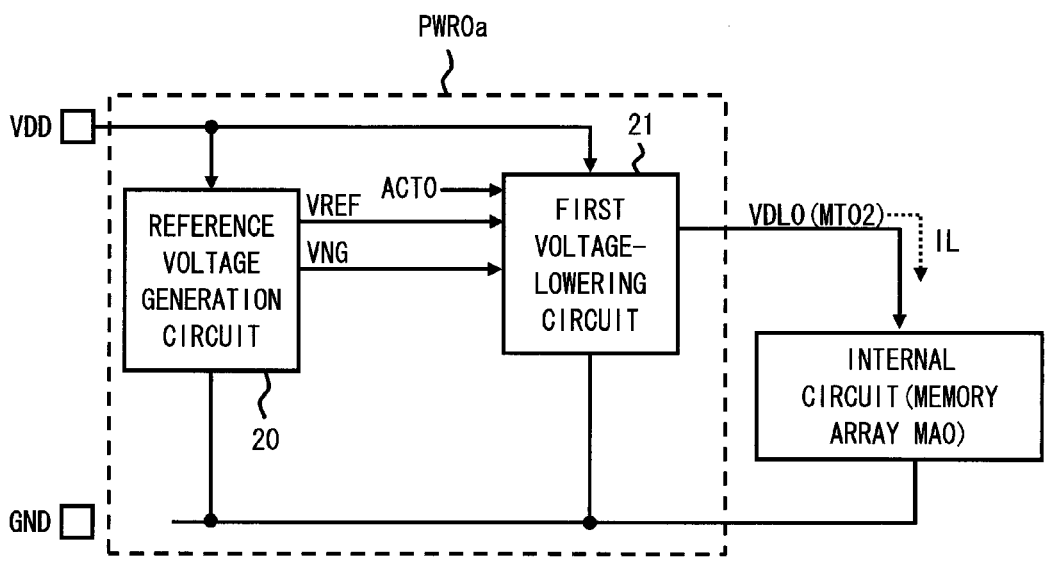
FIG. 16 is a block diagram of a power-supply circuit in a semiconductor device according to a fourth embodiment.
Figure 17:
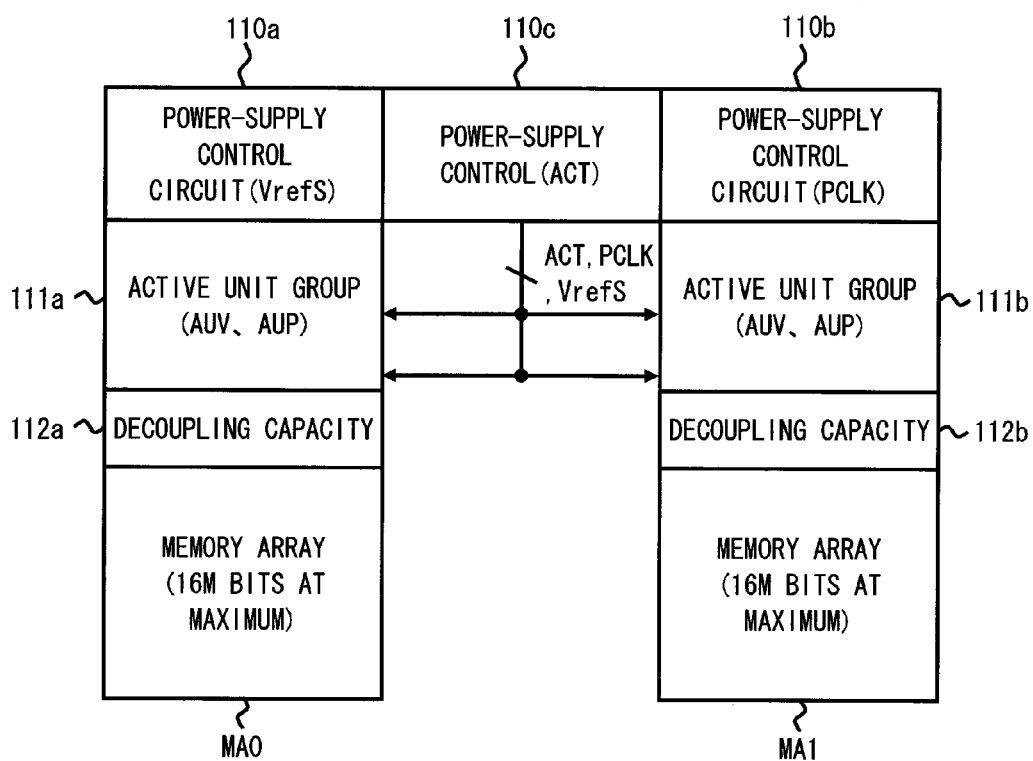
FIG. 17 is a schematic diagram showing a block layout of a semiconductor device disclosed in Japanese Unexamined Patent Application Publication No. 2001-127254.

FIG. 16 shows a block diagram of the power-supply circuit PWR0a. Note that the power-supply circuit PWR1a has the same circuit configuration as that of the power-supply circuit PWR0a. As shown in FIG. 16, the power-supply circuit PWR0a has a configuration that is obtained by removing the second voltage-lowering circuit 22 from the power-supply circuit PWR0 according to the first embodiment.

The second voltage-lowering circuit PWR has a current output capability corresponding to the leak current of the memory arrays MA0 and MA1. Further, the second voltage-lowering circuit PWR supplies an internal power-supply voltage to the memory arrays MA0 and MA1 through a line CMT2 formed in the same wiring layer as the first and second lines MT02 and MT12, and through an inter-block line MT3.

The second voltage-lowering circuit PWR operates at all times. Further, the second voltage-lowering circuit PWR has a limited current output capability. Therefore, the efficiency in size can be improved by providing one voltage-lowering circuit for a plurality of memory arrays. That is, by providing one second voltage-lowering circuit PWR for a plurality of memory arrays, the chip size can be further reduced in the semiconductor device 4.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

For example, although examples in which a voltage obtained by lowering an external power-supply voltage is supplied as an internal power-supply voltage is explained in the above-described embodiments, a voltage obtained by raising an external power-supply voltage can be also used as an internal power-supply voltage.

Furthermore, it is noted that, Applicant's intent is to encompass equivalents of all claim elements, even if amended later during prosecution.

The first to forth embodiments can be combined as desirable by one of ordinary skill in the art.

What is claimed is:

1. A semiconductor device comprising:
   first and second power-supply circuits;
   a first internal circuit coupled to the first power-supply circuit through a first power line;
   a second internal circuit coupled to the second power-supply circuit through a second power line;
   a third power line configured to couple the first power line to the second power line; and
   a control circuit configured to activate the first power-supply circuit from a first time point and to activate the second power-supply circuit from a second time point different from the first time point.

2. The semiconductor device according to claim 1, further comprising:
   a first decoupling capacitor coupled to the first power line; and
   a second decoupling capacitor coupled to the second power line,
   wherein the control circuit activates the second power-supply circuit in a predetermined operating cycle.

3. The semiconductor device according to claim 1,
   wherein the control circuit further activates the first and the second power-supply circuits in a predetermined operating cycle, and
   wherein the control circuit further activates the first and the second power-supply circuits in an exclusive manner.

4. A semiconductor device comprising:
   first and second power-supply circuits each of which generates an internal power-supply voltage by converting a voltage value of a power-supply voltage into a different voltage value;
   a first internal circuit that receives a supply of the internal power-supply voltage from the first power-supply circuit through a first line;
   a second internal circuit that receives a supply of the internal power-supply voltage from the second power-supply circuit through a second line;
   an inter-block line that connects the first and second lines to each other; and
   a control circuit that operates the first and second internal circuits in a predetermined operating cycle, and controls a length of a period during which the first and second internal circuits operate simultaneously.

5. The semiconductor device according to claim 4, further comprising a plurality of decoupling capacitances disposed between the first and second power-supply circuits and the first and second internal circuits and connected to the first and second lines respectively.

6. The semiconductor device according to claim 4, wherein the control circuit operates the first and second internal circuits in an exclusive manner.

7. The semiconductor device according to claim 4, wherein the control circuit starts to operate the first internal circuit in a period during which the second internal circuit is suspended.

8. The semiconductor device according to claim 4, wherein the first power-supply circuit has a current supply capability corresponding to an amount of current consumption of the first internal circuit, and the second power-supply circuit has a current supply capability corresponding to an amount of current consumption of the second internal circuit.

9. The semiconductor device according to claim 4, wherein the first and second power-supply circuits have an auxiliary power-supply circuit that generates the internal power-supply voltage in both of an operating period and a suspended period of the first and second internal circuits.

10. The semiconductor device according to claim 4, wherein each of the first and second internal circuits has a same circuit configuration.

11. The semiconductor device according to claim 4, wherein the first and second power-supply circuits generate the internal power-supply voltage by lowering the power-supply voltage.

12. The semiconductor device according to claim 4, wherein each of the first and second internal circuits has a memory array comprising a plurality of memory elements arranged in a lattice pattern, and an input-and-output circuit that performs a data writing process to the memory array and a data reading process from the memory array and operates based on the internal power-supply voltage.

13. A control method of an internal circuit of a semiconductor device,
    the semiconductor device comprising:
    first and second power-supply circuits each of which generates an internal power-supply voltage by converting a voltage value of a power-supply voltage into a different voltage value;
    a first internal circuit that receives a supply of the internal power-supply voltage from the first power-supply circuit through a first line;
    a second internal circuit that receives a supply of the internal power-supply voltage from the second power-supply circuit through a second line; and
    an inter-block line that connects the first and second lines to each other,
    the control method comprising:
    operating the first and second internal circuits in a predetermined operating cycle; and
    starting to operate the first internal circuit in a period during which an operation of the second internal circuit is suspended.

14. The control method of an internal circuit according to claim 13, wherein the first and second internal circuits are operated in an exclusive manner.

15. The control method of an internal circuit according to claim 14, wherein
    the second internal circuit starts to operate in a period during which the first internal circuit is operating, and repeats an operating state and a suspended state at a regular interval, and
    the first internal circuit continuously performs an operating cycle of an operating state.

* * * * *